US012622177B2

(12) United States Patent
Sasaki et al.

(10) Patent No.: US 12,622,177 B2
(45) Date of Patent: May 5, 2026

(54) PIEZOELECTRIC LAMINATE AND PIEZOELECTRIC ELEMENT

(71) Applicant: FUJIFILM Corporation, Tokyo (JP)

(72) Inventors: Tsutomu Sasaki, Kanagawa (JP); Fumihiko Mochizuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 924 days.

(21) Appl. No.: 17/891,850

(22) Filed: Aug. 19, 2022

(65) Prior Publication Data

US 2023/0070250 A1     Mar. 9, 2023

(30) Foreign Application Priority Data

Aug. 31, 2021     (JP) .................................. 2021-141806

(51) Int. Cl.
  *H10N 30/00*          (2023.01)
  *H10N 30/853*         (2023.01)
  *H10N 30/87*          (2023.01)

(52) U.S. Cl.
  CPC ....... *H10N 30/877* (2023.02); *H10N 30/8542* (2023.02)

(58) Field of Classification Search
  CPC ............. H10N 30/877; H10N 30/8542; H10N 30/704; H10N 30/708; H10N 30/8554
  See application file for complete search history.

(56) References Cited

U.S. PATENT DOCUMENTS

2007/0228894 A1   10/2007   Ishikura et al.
2008/0238264 A1   10/2008   Nakamura et al.

2010/0192341 A1    8/2010   Ishikura et al.
2011/0109701 A1*   5/2011   Ohashi ................. B41J 2/14233
                                                                  347/68
2011/0175012 A1*   7/2011   Harigai ................ H10N 30/076
                                                                  252/62.9 PZ
2011/0316393 A1*  12/2011   Naono ................. H10N 30/704
                                                                  204/192.1
2022/0093843 A1    3/2022   Umeda et al.

FOREIGN PATENT DOCUMENTS

EP          1 677 368 A2      7/2006
JP          8-116101 A        5/1996
JP          2003-188429 A     7/2003
JP          2007-300071 A    11/2007
JP          2012-9677 A       1/2012
JP          2015-041441 A     3/2015
JP          2018-85478 A      5/2018
WO      WO 2020/250591 A1    12/2020

OTHER PUBLICATIONS

Extended European Search Report for European Patent Application No. 22189580.8, dated Jan. 25, 2023.
Japanese Office Action for Japanese Application No. 2021-141806, dated Oct. 1, 2024, with an English translation.

* cited by examiner

*Primary Examiner* — Julio C. Gonzalez
(74) *Attorney, Agent, or Firm* — Birch, Stewart, Kolasch & Birch, LLP

(57)          ABSTRACT

The piezoelectric laminate and the piezoelectric element have, on a substrate in the following order, a lower electrode layer and a piezoelectric film containing a perovskite-type oxide, in which the lower electrode layer includes the metal layer containing Ni and a surface layer containing a Ni oxide or a Ni oxynitride, and in the lower electrode layer, the surface layer is arranged on the side closest to the piezoelectric film.

8 Claims, 4 Drawing Sheets

PIEZOELECTRIC LAMINATE AND PIEZOELECTRIC ELEMENT

CROSS REFERENCE TO RELATED APPLICATIONS

The present application claims priority under 35 U.S.C. § 119 to Japanese Patent Application No. 2021-141806 filed on Aug. 31, 2021. The above application is hereby expressly incorporated by reference, in its entirety, into the present application.

BACKGROUND OF THE INVENTION

1. Field of the Invention

The present disclosure relates to a piezoelectric laminate and a piezoelectric element.

2. Description of the Related Art

As a material having excellent piezoelectricity and excellent ferroelectricity, there is known a perovskite-type oxide such as lead zirconate titanate ($Pb(Zr,Ti)O_3$, hereinafter referred to as PZT). A piezoelectric body consisting of a perovskite-type oxide is applied as a piezoelectric film in a piezoelectric element having a lower electrode, a piezoelectric film, and an upper electrode on a substrate. This piezoelectric element has been developed into various devices such as a memory, an inkjet head (an actuator), a micromirror device, an angular velocity sensor, a gyro sensor, a piezoelectric micromachined ultrasonic transducer (PMUT), and an oscillation power generation device.

The piezoelectric characteristics greatly change due to the excess or deficiency of oxygen in the perovskite structure of the perovskite-type oxide. In particular, in a perovskite-type oxide containing Pb such as a PZT film, oxygen is easily eliminated, and the oxygen defect in the piezoelectric film easily causes the deterioration of piezoelectric characteristics and the deterioration of durability. In order to suppress the oxygen elimination in the perovskite-type oxide, it is effective to use a conductive oxide such as SRO ($SrRuO_3$) or $IrO_2$ in regions of the lower electrode and the upper electrode, where these regions are in contact with the piezoelectric film. Further, in a case where a conductive oxide is used in the region in contact with the piezoelectric film, an electrode layer consisting of a layer of a noble metal such as Pt or Ir is generally laminated on the conductive oxide layer in order to ensure good conductivity (see, for example, JP2018-085478A).

JP2007-300071A proposes a piezoelectric element having a PZT film, in which a lower electrode has a configuration such that an amount of a conductive oxide is large on a side of a substrate and an amount of a conductive metal is large on a side of a piezoelectric film in order to improve the adhesiveness at each interface between the substrate and the lower electrode and between the lower electrode and the piezoelectric film. Further, it describes that a Pt group is preferable as the conductive metal contained in the lower electrode.

SUMMARY OF THE INVENTION

As described in JP2018-085478A, in a piezoelectric element having a piezoelectric film of perovskite-type oxide, deterioration of piezoelectric characteristics can be suppressed by providing a conductive oxide layer on the side of the piezoelectric film of the electrode layer. Further, as described in JP2018-085478A and JP2007-300071A, a noble metal which is a Pt group is generally used in the lower electrode.

However, since a metal of the platinum group is very expensive, there is a problem that it is not possible to sufficiently suppress the manufacturing cost of a piezoelectric element having an electrode containing the platinum group.

The present disclosed technology has been made in consideration of the above circumstances, and an object of the present disclosed technology is to provide a piezoelectric laminate and a piezoelectric element, which makes it possible to suppress the deterioration of piezoelectric characteristics and suppress the manufacturing cost.

The piezoelectric laminate of the present disclosure is a piezoelectric laminate comprising, on a substrate in the following order:

a lower electrode layer; and a piezoelectric film containing a perovskite-type oxide, in which the lower electrode layer includes a metal layer containing Ni and a surface layer containing a Ni oxide or a Ni oxynitride, and in the lower electrode layer, the surface layer is arranged on the side closest to the piezoelectric film.

In the piezoelectric laminate of the present disclosure, it is preferable that in a thickness direction of the surface layer, a content of a Ni element changes in an increasing trend from the side closest to the piezoelectric film to the metal layer, the change in the content of the Ni element is continuous, and the change in the content of the Ni element from the surface layer to the metal layer is continuous.

In the piezoelectric laminate of the present disclosure, it is preferable that the thickness of the surface layer is 20 nm to 60 nm.

In the piezoelectric laminate of the present disclosure, it is preferable that an alignment control layer containing a metal oxide different from the Ni oxide is provided between the lower electrode layer and the piezoelectric film. Here, the metal oxide preferably contains at least one of Sr or Ba.

In the piezoelectric laminate of the present disclosure, it is preferable that the perovskite-type oxide contains Pb, Zr, Ti, and O.

In the piezoelectric laminate of the present disclosure, it is preferable that the perovskite-type oxide contains at least one of Nb, Sc, or Ni.

In the piezoelectric laminate of the present disclosure, it is preferable that the perovskite-type oxide is a compound represented by General Formula (1), $$Pb\{(Zr_xTi_{1-x})_{1-y}Nb_y\}O_3 \tag{1}$$

$$0<x<1, 0.1 \leq y \leq 0.4.$$

The piezoelectric element of the present disclosure has the piezoelectric laminate of the present disclosure and an upper electrode layer provided on the piezoelectric film of the piezoelectric laminate.

According to the piezoelectric laminate and the piezoelectric element of the present disclosure, it is possible to provide a piezoelectric laminate and a piezoelectric element, which makes it possible to suppress the deterioration of piezoelectric characteristics and suppress the manufacturing cost.

DESCRIPTION OF THE PREFERRED EMBODIMENTS

Figure 1:
FIG. 1 is a cross-sectional view illustrating a layer configuration of a piezoelectric laminate and a piezoelectric element, according to a first embodiment.
Figure 1:
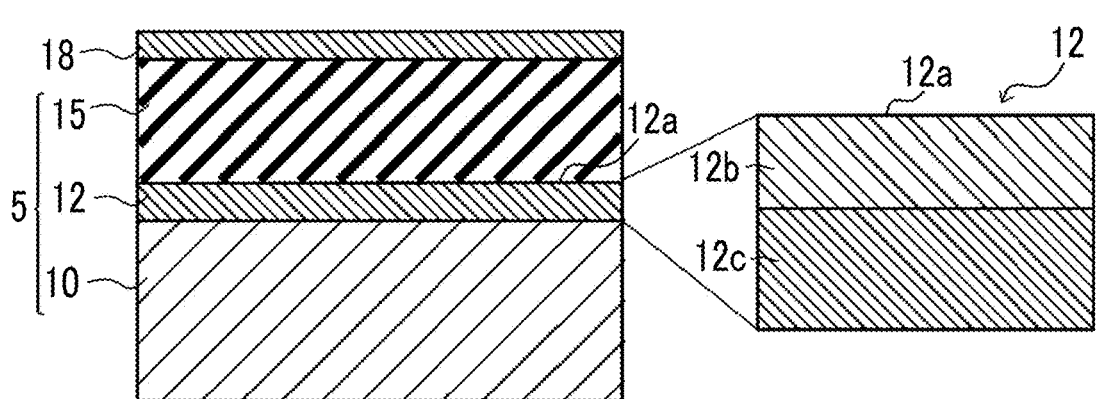

Hereinafter, embodiments of the present invention will be described with reference to the drawings. In the drawings below, the layer thickness of each of the layers and the ratio therebetween are appropriately changed and drawn for easy visibility, and thus they do not necessarily reflect the actual layer thickness and ratio.

Piezoelectric laminate 5 and piezoelectric element 1, according to first embodiment FIG. 1 is a cross-sectional view illustrating layer configurations of a piezoelectric laminate 5 and a piezoelectric element 1 having the piezoelectric laminate 5, according to a first embodiment. As illustrated in FIG. 1, the piezoelectric element 1 has the piezoelectric laminate 5 and an upper electrode layer 18. The piezoelectric laminate 5 has a substrate 10, and a lower electrode layer 12 and a piezoelectric film 15 which are laminated on the substrate 10. Here, "lower" and "upper" do not respectively mean top and bottom in the vertical direction. As result, an electrode arranged on the side of the substrate 10 with the piezoelectric film 15 being interposed is merely referred to as the lower electrode layer 12, and an electrode arranged on the side of the piezoelectric film 15 opposite to the substrate 10 is merely referred to as the upper electrode layer 18.

In the piezoelectric laminate 5, the lower electrode layer 12 includes a metal layer 12c containing Ni and a surface layer 12b containing a Ni oxide or a Ni oxynitride. In the lower electrode layer 12, the surface layer 12b is arranged on the side closest to the piezoelectric film 15. In this example, the surface layer 12b and the piezoelectric film 15 are formed to be in contact with each other, and a Ni oxide or a Ni oxynitride is present at the boundary 12a therebetween.

The "metal layer" refers to a layer that consists of only metal species excluding unavoidable impurities, and specifically, it is a layer in which 95 at % or more of the constituent elements are metal elements. The "metal layer containing Ni" means that the metal layer contains the Ni element as the main component of the metal layer 12c. It is noted that the main component means a component having 50 at % or more. Further, also in the surface layer 12b containing a Ni oxide or a Ni oxynitride, the main component of the metal species among the elements constituting the surface layer 12b is the Ni element. Examples of the metal species other than the Ni contained in the lower electrode layer 12 include Cu, Al, Ti, Ta, Cr, and Fe. However, in a case where the metal species contained in the lower electrode layer 12 is only Ni element, the number of material species can be reduced and the manufacturing method can be simplified, which is preferable.

The surface layer 12b also contains Ni as the main component of the metal species. However, the entire Ni may be oxidized or nitrided, or Ni which is not oxidized and nitrided, a Ni oxide, and a Ni oxynitride may be in a state of being mixed. However, it is preferable that 20 at % or more of the Ni present at the surface layer 12b is nitrided or oxynitrided, and it is more preferable that 30 at % or more thereof is nitrided or oxynitrided.

The thickness t of the lower electrode layer 12 is preferably about 50 nm to 300 nm and more preferably 100 nm to 300 nm. The lower electrode layer 12 preferably a Ni oxide or a Ni oxynitride in a range of 20 nm or more from the side closest to the piezoelectric film 15, and more preferably contains a Ni oxide or a Ni oxynitride in a range of 30 nm or more from the side closest to the piezoelectric film 15. In order to ensure sufficient conductivity without the thickness t of the lower electrode layer 12 becoming too thick, the range containing the Ni oxide is preferably 60 nm or less from the side closest to the piezoelectric film 15. That is, it contains a Ni oxide or a Ni oxynitride preferably over 20 nm to 60 nm, and more preferably 40 nm to 60 nm from the side closest to the piezoelectric film 15, in the lower electrode layer 12. As a result, the thickness t1 of the surface layer 12b is preferably 20 nm to 60 nm and more preferably 40 nm to 60 nm. In addition, the thickness t2 of the metal layer 12c of the lower electrode layer 12 is preferably 50 nm to 200 nm and more preferably 80 nm to 150 nm. The thickness can be estimated from a scanning electron microscope (SEM) image of a cross section and a transmission electron microscope (TEM) or secondary ion mass spectrometry (SIMS) analysis.

The piezoelectric film 15 contains a perovskite-type oxide. It is preferable that the piezoelectric film 15 is occupied by 80% by mole or more of the perovskite-type oxide. Further, it is preferable that the piezoelectric film 15 is consisting of a perovskite-type oxide (however, it contains unavoidable impurities).

The perovskite-type oxide is represented by the general formula $ABO_3$.

In the general formula, A is an A-site element, which is one of Pb, barium (Ba), lanthanum (La), Sr, bismuth (Bi), lithium (Li), sodium (Na), calcium (Ca), cadmium (Cd), magnesium (Mg), or potassium (K), or a combination of two or more thereof.

In the general formula, B is a B-site element, which is one of Ti, Zr, vanadium (V), Nb, Ta, chromium (Cr), molybdenum (Mo), tungsten (W), manganese (Mn), iron (Fe), Ru, cobalt (Co), Ir, nickel (Ni), copper (Cu), zinc (Zn), gallium (Ga), In, Sn, antimony (Sb), or a lanthanide element, or a combination of two or more thereof.

In the general formula, O is oxygen.

Regarding A:B:O, a reference ratio is 1:1:3; however, it suffices that the ratio is in a range in which a perovskite structure is obtained.

It is particularly preferable that the piezoelectric film 15 contains Pb as the main component of the A site. It is noted that in the present specification, "the main component" means a component of which the occupation is 50% by mole or more. That is, "contains Pb as the main component of the A site" means that the component having 50% by mole or more among the A site elements is Pb. In the perovskite-type oxide containing Pb, the elements in the A site other than Pb and the elements of the B site are not particularly limited.

The perovskite-type oxide is preferably a lead zirconate titanate (PZT) type that contains lead (Pb), zirconium (Zr), titanium (Ti), and oxygen (O).

In particular, it is preferable that the perovskite-type oxide is a compound represented by General Formula (P), which contains an additive B1 in the B site of PZT.

$$Pb\{(Zr_xTi_{1-x})_{1-y}B1_y\}O_3 \qquad (P)$$

Here, $0<x<1$ and $0<y<0.3$ are satisfied. It is noted that regarding Pb:$\{(Zr_xTi_{1-x})_{1-y}B1_y\}$:O in General Formula (P), a reference ratio thereof is 1:1:3; however, it suffices that the ratio is in a range in which a perovskite structure is obtained.

Examples of the B1 include scandium (Sc), V, Nb, Ta, Cr, Mo, W, Mn, Fe, Ru, Co, Ir, Ni, Cu, Zn, Ga, In, Sn, and Sb. It is preferable to contain one or more elements among these elements. B1 is more preferably any one of Sc, Nb, or Ni.

In particular, it is preferable that B1 is Nb and that the perovskite-type oxide contains Nb. A compound represented by General Formula (1) is particularly preferable.

$$Pb\{(Zr_xTi_{1-x})_{1-y}Nb_y\}O_3 \qquad (1)$$

$$0<x<1, 0.1 \leq y \leq 0.4.$$

The film thickness of the piezoelectric film 15 is not particularly limited, and it is generally 200 nm or more, for example, 0.2 µm to 5 µm. The film thickness of the piezoelectric film 15 is preferably 1 µm or more.

The substrate 10 is not particularly limited, and examples thereof include substrates such as silicon, glass, stainless steel, yttrium-stabilized zirconia, alumina, sapphire, and silicon carbide. As the substrate 10, a laminated substrate having a $SiO_2$ oxide film formed on the surface of the silicon substrate may be used.

The upper electrode layer 18 is paired with the lower electrode layer 12 and is an electrode for applying a voltage to the piezoelectric film 15. The main component of the upper electrode layer 18 is not particularly limited, and examples thereof include metals such as gold (Au), platinum (Pt), iridium (Ir), ruthenium (Ru), titanium (Ti), molybdenum (Mo), tantalum (Ta), aluminum (Al), copper (Cu), silver (Ag), chromium (Cr), such as zinc (Zr), and metal oxides thereof, as well as combinations thereof. Further, as the upper electrode layer 18, indium tin oxide (ITO), IGZO, $LaNiO_3$, SRO (which may contain Ba), or the like may be used. The upper electrode layer 18 may be a single layer or may have a laminated structure composed of a plurality of layers. It is noted that from the viewpoint of suppressing oxygen diffusion from the piezoelectric film 15, at least a region of the upper electrode layer 18, which is in contact with the piezoelectric film, is preferably an oxide electrode.

The layer thickness of the upper electrode layer 18 is not particularly limited, and it is preferably about 50 nm to 300 nm and more preferably 100 nm to 300 nm.

As described above, in the piezoelectric laminate 5 and the piezoelectric element 1 according to the present embodiment, the lower electrode layer 12 includes the metal layer 12c containing Ni and the surface layer 12b containing a Ni oxide or a Ni oxynitride, and in the lower electrode layer 12, the surface layer 12b is arranged on the side closest to the piezoelectric film 15. In a case where the region in the lower electrode layer 12 on the side closest to the piezoelectric film 15 is a metal layer, oxygen in the piezoelectric film 15 may leak and migrate to the side of the lower electrode layer 12. The leakage of oxygen in the piezoelectric film 15 leads to the deterioration of piezoelectric characteristics and the deterioration of long-term reliability (durability). However, in the piezoelectric laminate 5 and the piezoelectric element 1 according to the present embodiment, the surface layer 12b containing a Ni oxide or a Ni oxynitride is arranged on the side closest to the piezoelectric film 15, and thus the oxygen leakage in the piezoelectric film 15 can be suppressed. As a result, it is possible to suppress the deterioration of piezoelectric characteristics and the deterioration of long-term reliability.

Further, Ni is used as a metal species in the constituent elements of the lower electrode layer 12, and thus the manufacturing cost can be significantly reduced as compared with the piezoelectric element in the related art, in which a metal of the Pt group has been used as the main component.

Further, according to the findings of the inventors of the present invention, in a case where an electrode layer consisting of Ir is used as the lower electrode layer, the adhesiveness to the substrate is low, and thus in practical use, an intimate attachment layer such as TiW is essential before forming a film of Ir on the substrate. However, in a case where the Ni metal layer 12c is provided in the lower electrode layer 12 on the side of the substrate 10 as in the present embodiment, sufficient adhesiveness can be ensured even in a case where the intimate attachment layer is not provided. That is, in a case where a configuration in which the Ni metal layer 12c is in contact with the substrate is adopted, the intimate attachment layer is unnecessary, and thus the manufacturing cost can be further suppressed.

In a case where the thickness of the surface layer 22b of the lower electrode layer 12 is 20 nm to 60 nm, the effect of suppressing the generation of the oxygen defect in the piezoelectric film 15 is further enhanced, and the deterioration of piezoelectric characteristics and the deterioration of long-term reliability can be further suppressed.

Figure 2:
FIG. 2 is a cross-sectional view illustrating a layer configuration of a piezoelectric laminate and a piezoelectric element according to a second embodiment.
Figure 2:
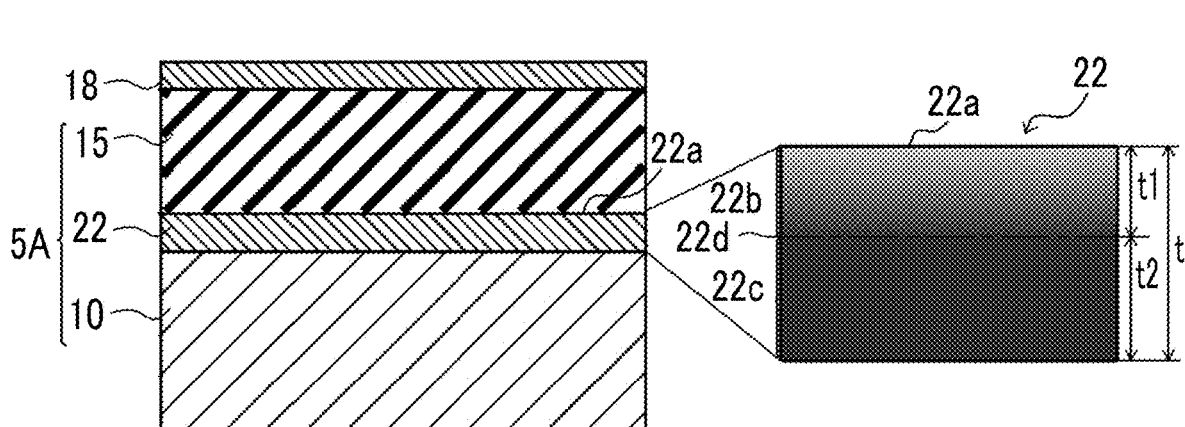

Piezoelectric laminate and piezoelectric element, according to second embodiment FIG. 2 is a cross-sectional schematic view illustrating a piezoelectric laminate 5A and a piezoelectric element 1A having the piezoelectric laminate 5A, according to a second embodiment. In FIG. 2, the same reference numerals are respectively assigned to the same constituent elements as those of the piezoelectric laminate 5 and the piezoelectric element 1 according to the first embodiment shown in FIG. 1, and the detailed description thereof will be omitted.

In the piezoelectric laminate 5A and the piezoelectric element 1A according to the second embodiment, the configuration of the lower electrode layer 22 is different from the lower electrode layer 12 in the piezoelectric laminate 5 and the piezoelectric element 1 according to the first embodiment.

In the piezoelectric laminate 5A and the piezoelectric element 1A according to the present embodiment, the content of the Ni element changes in an increasing trend from the side closest to the piezoelectric film 15 toward the metal layer 22c in the thickness direction of the surface layer 22b, and the change in the content of the Ni element in the thickness direction is continuous. Further, the change in the content from the surface layer 22b to the metal layer 22c is continuous. Here, "the content of the Ni element in the thickness direction" is a proportion of the Ni element with respect to all elements at each position in the thickness direction, and it is indicated in the unit of at %. The "thickness direction" is a direction perpendicular to the substrate 10. "The change in the content is continuous" means that there are no discontinuous portions in the content profile in the thickness direction (see FIG. 2). In the lower electrode layer 22, it is preferable that among the constituent elements constituting the lower electrode layer 22 other than the Ni element, the content of the element which constitutes the lower electrode layer 22 and of which the content is 10 at % or more in the entire region of the lower electrode layer 22 is constant or continuously changes in the thickness direction.

Figure 3:
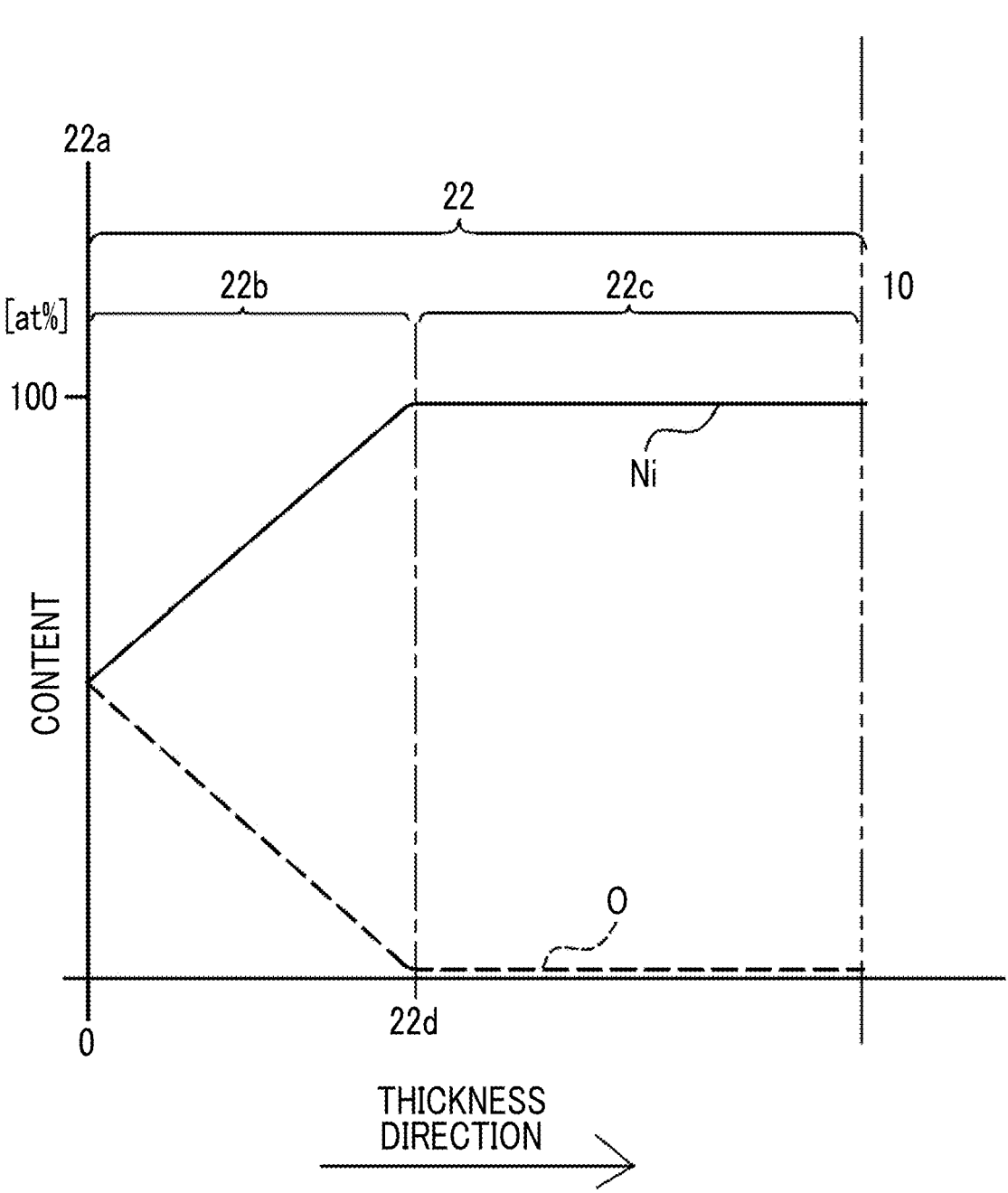
FIG. 3 is a graph showing profiles of contents of a Ni element and an O element in a thickness direction of a lower electrode layer in the piezoelectric element illustrated in FIG. 2.

The enlarged view in FIG. 2 schematically illustrates the change in the content of the Ni element in the lower electrode layer 22. In the enlarged view in FIG. 2, the larger the content of the Ni element is, the darker the color is, and the smaller the content is, the lighter the color is. Further, FIG. 3 illustrates the change (the content profile) in the content of each of the Ni element and the O element, contained in the lower electrode layer 22 in the thickness direction. The horizontal axis indicates the position of the lower electrode layer 22 in the thickness direction. 0 on the horizontal axis is the position (a boundary 22*a*) in the lower electrode layer 22 on the side closest to the piezoelectric film 15, and the two-dot chain line position is the boundary with respect to the substrate 10.

As shown in FIG. 3, in the present embodiment, the lower electrode layer 22 contains the Ni element over the entire region in the thickness direction. In the thickness direction of the surface layer 22*b*, the content of the Ni element changes in an increasing trend from the boundary 22*a* with respect to the piezoelectric film 15, which is on the side closest to the piezoelectric film 15, toward the metal layer 22*c*. In addition, the content of the Ni element from the surface layer 22*b* to the metal layer 22*c* changes continuously. More specifically, the content of the Ni element monotonically increases from the side closest to the piezoelectric film 15 (the boundary 22*a*) of the surface layer 22*b* to the metal layer 22*c* of the surface layer 22*b*, and the content of the Ni element increases until it reaches the content of the Ni element of the metal layer 22*c*. In the present embodiment, the content of the Ni element is substantially constant in the metal layer 22*c* in the thickness direction, and it exhibits substantially 100 at %. Here, the increasing trend indicates that in a case where a start point and an end point are compared, the content of the end point is larger than that of the start point, and thus the content tends to increase as a whole. For example, as in FIG. 3, in the content profile in which the side on the left is denoted by the side of the piezoelectric film 15 and the side on the right is denoted by the side of the substrate 10, in a case where the content decreases to cause a portion where the measurement error is exceeded, even such a case is also included in the increasing trend as long as the content is on the rise as a whole. Further, "monotonically increases" means that the content increases without including a case where the content decreases to cause a portion where the measurement error is exceeded in the content profile.

The preferred ranges of the thicknesses of the lower electrode layer 12, the surface layer 22*b*, and the metal layer 22*c* in the present embodiment are respectively the same as the preferred ranges of the thickness t of the lower electrode layer 12, the thickness t1 of the surface layer 12*b*, and the thickness t2 of the metal layer 12*c* in the first embodiment described above. However, since the content of the Ni element continuously changes from the surface layer 22*b* to the metal layer 22*c*, the boundary 22*d* between the surface layer 22*b* and the metal layer 22*c*, in the lower electrode layer 22, is not clear, for example, in an electron microscopic image. For this reason, the respective thicknesses t1 and t2 of the surface layer 22*b* and the metal layer 22*c* are determined from the composition distribution in the thickness direction of the lower electrode layer 22, that is, from the measurement data of the content change of the constituent elements (see FIGS. 3 and 6). Specifically, in the profile shown in FIG. 3 or FIG. 6, the region where the O element (or the O element and the N element) exhibits a constant value of the lowest value (almost 0 at %) is regarded as the metal layer 22*c*.

The content of the element in the lower electrode layer 22 and the change in the content of the element in the thickness direction can be measured by the secondary ion mass spectrometry (SIMS) analysis. In the present disclosure, the content of the element is a value measured according to SIMS. Further, since the content fluctuates by about ±5 at % due to noise in the actual measurement data, the fluctuation of about ±5 at % is regarded as the range of measurement error.

In the present embodiment, the lower electrode layer 22 is composed of Ni and oxygen (O) (however, it contains unavoidable impurities), and in the thickness direction of the surface layer 22*b* of the lower electrode layer 22, the profile that shows the change in the content of the O element is symmetrical with the profile that shows the change in the content of the Ni element, with the line of the content of 50 at % being as the axis of symmetry. That is, the content of the N element continuously decreases from the boundary 22*a*, which is on the side closest to the piezoelectric film 15, toward the side of the metal layer 22*c*, and then exhibits a constant value of almost 0 at %. It is noted that in a case where the surface layer 22*b* contains a Ni oxynitride and the profile of the Ni content is the profile shown in FIG. 3, the profile of the total content of the content of the O element and the content of the N element is the same as the profile of the O element shown in FIG. 3.

In the embodiment shown in FIG. 3, an example is shown in which almost whole Ni is oxidized at the boundary 22*a* of the lower electrode layer 22 with respect to the piezoelectric film 15. However, at the boundary 22*a*, the oxidized Ni or nitrided Ni may be mixed with the oxidized or oxynitrided Ni. However, it is preferable that 20 at % or more of the Ni present at the boundary 22*a* is nitrided or oxynitrided, and it is more preferable that 30 at % or more thereof is nitrided or oxynitrided. Further, in the entire surface layer 22*b*, it is preferable that 20 at % or more of the Ni element is nitrided or oxynitrided, and it is more preferable that 30 at % or more thereof is nitrided or oxynitrided.

As described above, in the piezoelectric laminate 5A and the piezoelectric element 1A according to the present embodiment, similarly to the piezoelectric laminate 5 and the piezoelectric element 1 according to the first embodiment, the lower electrode layer 22 includes the metal layer 22*c* containing a Ni element and the surface layer 22*b* containing a Ni oxide or a Ni oxynitride, and in the electrode layer 22, the surface layer 22*b* is arranged on the side closest to the piezoelectric film 15. For this reason, it is possible to suppress the oxygen in the piezoelectric film 15, and as a result, it is possible to suppress the deterioration of piezoelectric characteristics and the deterioration of long-term reliability.

Further, Ni is used as a metal species of the lower electrode layer 22, and thus the manufacturing cost can be significantly reduced as compared with the piezoelectric element in the related art, in which a metal of the Pt group has been used as the main component.

Further, in the piezoelectric laminate 5A and the piezoelectric element 1A according to the present embodiment, the content of the Ni element of the lower electrode layer 22 changes in an increasing trend from the side closest to the piezoelectric film 15 to the metal layer 22*c* in the thickness direction of the surface layer 22*b*, and the change of the content is continuous. Further, the change in the content from the surface layer 22b to the metal layer 22c is continuous. In a case where the change in the content of the Ni element in the thickness direction is discontinuous, the adhesiveness may be deteriorated at the discontinuous portion, whereby peeling may occur. However, in a case where the change in the content of the Ni element in the surface layer 22b of the lower electrode layer 22 and in a portion from the surface layer 22b to the metal layer 22c is continuous as in the present embodiment, the occurrence of peeling can be suppressed. In the region in the lower electrode layer 22 on the side closest to the piezoelectric film 15, the closer the content ratio of Ni to O is to that of NiO, that is, 1:1, which is the stoichiometric ratio in the Ni oxide, the higher the effect of suppressing oxidation is. On the other hand, the higher the proportion of the non-oxidized metal Ni in the lower electrode layer 22 is, the higher the conductivity and the higher the functionality is as the lower electrode layer 22. As a result, in a case where the content of the Ni element is in an increasing trend from the side of the piezoelectric film 15 toward the metal layer 22c as in the present embodiment, the effect of suppressing the generation of the oxygen defect in the piezoelectric film 15 can be enhanced, and the effect of suppressing the deterioration of conductivity can be suppressed.

Further, in a case where the content of the Ni element monotonically increases from the side of the piezoelectric film 15 as in the piezoelectric laminate 5A and the piezoelectric element 1A according to the above embodiment, it is possible to further enhance the effect of suppressing the generation of oxygen defect in the piezoelectric film 15 and the effect of suppressing the deterioration of conductivity.

As described above, in the piezoelectric laminate 5A and the piezoelectric element 1A according to the above embodiment, the change in the content of the Ni element in the thickness direction of the lower electrode layer 22 is as shown in FIG. 3. However, the change in the content of the Ni element in the thickness direction of the lower electrode layer 22 is not limited to that shown in FIG. 3.

Figure 4:
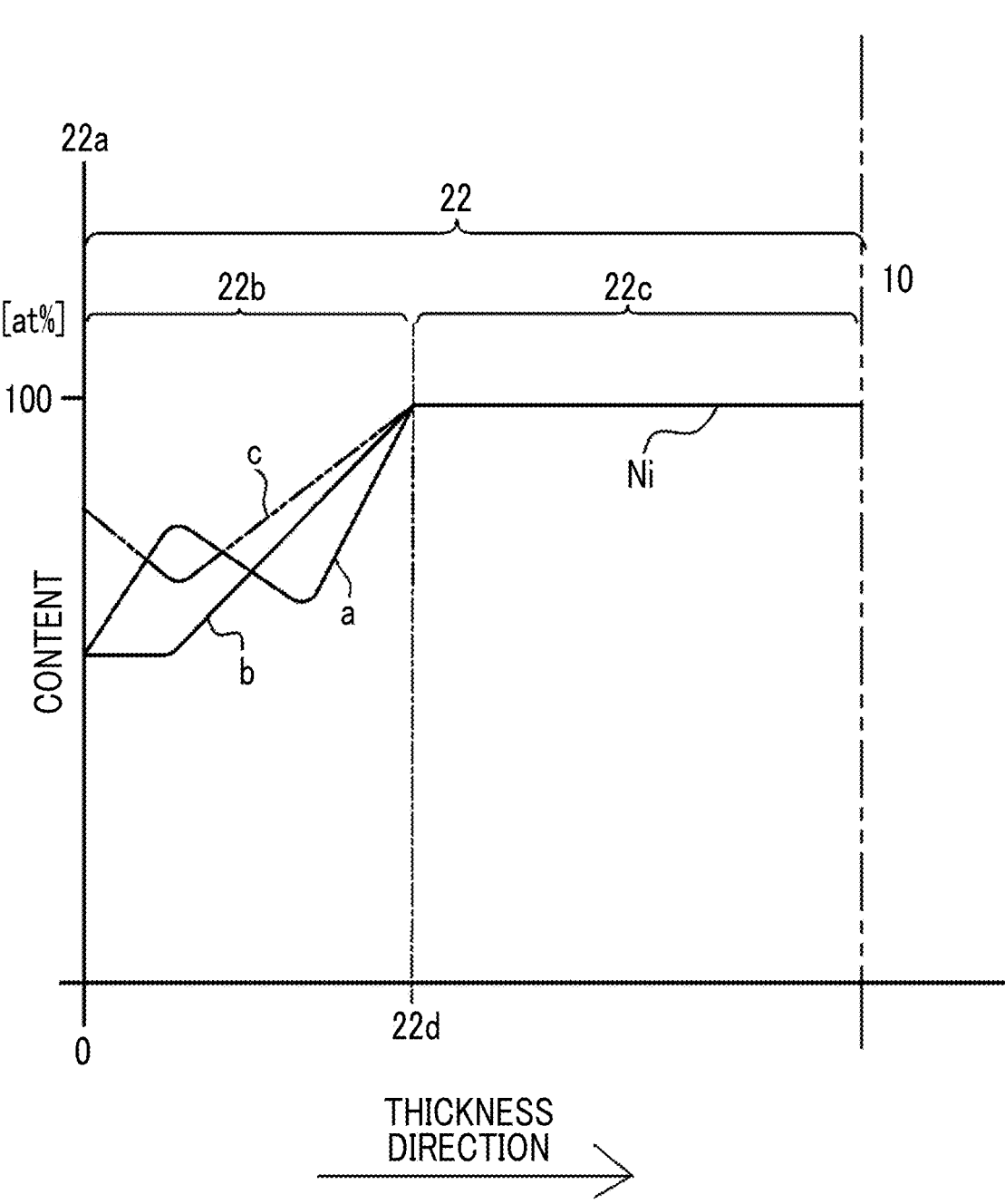
FIG. 4 is a graph showing another profile of the contents of the Ni element in a thickness direction of a lower electrode layer in the piezoelectric element illustrated in FIG. 2.

FIG. 4 shows other examples (profiles a to c) of the change in the content of the Ni element in the lower electrode layer 22 in the thickness direction of the surface layer 22b. In FIG. 4, as in FIG. 3, the horizontal axis indicates the position of the lower electrode layer 22 in the thickness direction. 0 on the horizontal axis is the position (a boundary 22a) in the lower electrode layer 22 on the side closest to the piezoelectric film 15, and the two-dot chain line position is the boundary with respect to the substrate 10. Although not illustrated in FIG. 4, the respective profiles of the O element are, for example, symmetrical with the profile of the Ni element, with the line of the content of 50 at % being as the central axis.

As shown in the profile a of FIG. 4, the content of the Ni element in the thickness direction of the surface layer 22b is about 50 at % at the boundary 22a with respect to the piezoelectric film 15, and it gradually increases toward the side of the metal layer 22c to take the maximum value. Then, it may decrease once and further increase to match the content in the metal layer 22c at the boundary of the metal layer 22c. The profile a has a high Ni element content at the boundary 22d (the end point) with respect to the metal layer 22c as compared with the boundary 22a (the start point) with respect to the piezoelectric film 15, and thus it can be said that the content changes in an increasing trend from the side of the piezoelectric film 15 toward the metal layer 22c.

In addition, as shown in the profile b of FIG. 4, the content of the Ni element in the thickness direction of the surface layer 22b is about 50 at % at the boundary 22a with respect to the piezoelectric film 15, and it exhibits a constant value for a while from the boundary 22a toward the metal layer 22c. Then, it may monotonically increase to match the content in the metal layer 22c at the boundary of the metal layer 22c.

In the embodiment and profiles a and b, which are described above, the content of the Ni element is substantially 50 at % in the lower electrode layer 22 on the side closest to the piezoelectric film 15. In a case where the lower electrode layer 22 is composed of the Ni element and the O element, the content of the Ni element is 50 at %, and the content of the O element is 50 at % in a case where the Ni element is completely nitrided at the boundary 22a on the side of the piezoelectric film 15. In this case, the non-oxidized Ni element is not present, and thus the effect of suppressing the generation of oxygen defect in the piezoelectric film 15 is high.

However, as shown in the profile c of FIG. 4, the content of the Ni element at the boundary 22a in the lower electrode layer 22 on the side closest to the piezoelectric film 15 is not limited to 50 at %, and it may be larger than 50 at %. Further, as shown in the profile c of FIG. 4, the content once decreases from the side closest to the piezoelectric film 15 toward the metal layer 22c to a content lower than the content of the Ni element at the boundary 22a. Then, it may increase to match the content in the metal layer 22c at the boundary of the metal layer 22c.

In any case of the profiles a to c, the lower electrode layer 22 has the metal layer 22c containing a Ni element and the surface layer 22b containing a Ni nitride, and the surface layer 22b is arranged on the side closest to the piezoelectric film 15. As a result, it is possible to suppress the occurrence of the oxygen defect in the piezoelectric film, and it is possible to obtain the effects of improving piezoelectric characteristics and long-term reliability. Further, in all of the profiles a to c, the content of the Ni element in the lower electrode layer 22 changes in an increasing trend from the side closest to the piezoelectric film 15 to the metal layer 22c in the thickness direction of the surface layer 22b, the change thereof in the content is continuous, and the change in the content of the Ni element from the surface layer 22b to the metal layer 22c is continuous. As a result, the occurrence of peeling can be suppressed, the effect of suppressing the generation of oxygen defect in the piezoelectric film 15 can be enhanced, and the effect of suppressing the deterioration of conductivity can be suppressed.

In each of the above embodiments, the content of the Ni element in the metal layer 12c or 22c has been described as being constant in the thickness direction. However, it is noted that the content of the Ni element in the metal layer 12c or 22c in the thickness direction. In this case, the content of metal species other than the Ni element increases or decreases in association with the change in the content of the Ni element.

Figure 5:
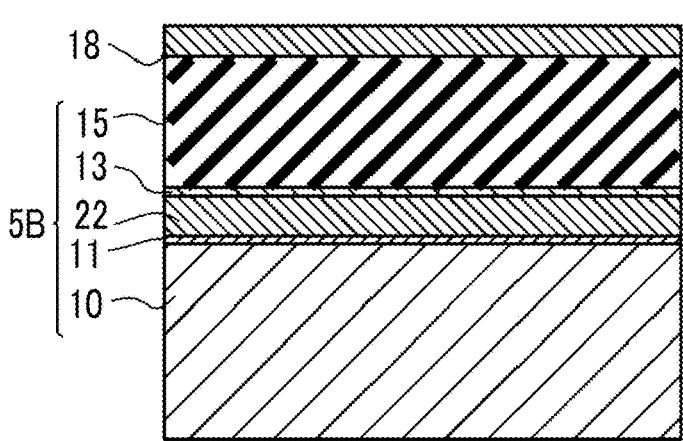
FIG. 5 is a cross-sectional view illustrating a layer configuration of a piezoelectric laminate and a piezoelectric element according to a third embodiment.

Piezoelectric laminate 5B and piezoelectric element 1B, according to third embodiment FIG. 5 is a cross-sectional schematic view illustrating a piezoelectric laminate 5B and a piezoelectric element 1B having the piezoelectric laminate 5B, according to a second embodiment. In FIG. 5, the same reference numerals are respectively assigned to the same constituent elements as those of the piezoelectric laminates 5 and 5A and the piezoelectric elements 1 and 1A according to the first embodiment and the second embodiment shown in FIG. 1 and FIG. 2, and detailed description thereof will be omitted.

As illustrated in FIG. 5, the piezoelectric laminate 5B and the piezoelectric element 1B have an intimate attachment layer 11 between the substrate 10 and the lower electrode layer 22. Further, an alignment control layer 13 is provided between the lower electrode layer 22 and the piezoelectric film 15.

The intimate attachment layer 11 is provided for improving the adhesiveness between the substrate 10 and the lower electrode layer 22 and suppressing peeling. For the intimate attachment layer 11, Ti, W, TiW, or the like is preferably used.

The alignment control layer 13 is formed on the lower electrode layer 22. The alignment control layer 13 is a layer provided for suppressing the generation of a pyrochlore phase that is easily formed at the initial stage of film formation of the piezoelectric film 15 and obtaining a good perovskite-type oxide. The alignment control layer 13 contains a metal oxide different from the Ni oxide. The metal oxide preferably contains at least one of Sr or Ba.

Further, as the alignment control layer 13, it is preferable to use, for example, the growth control layer described in WO2020/250591A, WO2020/250632A, JP2020-202327A, or the like.

That is, the alignment control layer 13 preferably contains a metal oxide represented by General Formula (2).

$$Ma_dMb_{1-d}O_e \qquad (2)$$

Ma is one or more metal elements that can be replaced with the metal in the A site of the perovskite-type oxide.

Mb consists of metal species that can be replaced with the metal in the B site of the perovskite-type oxide, where the main component thereof is one of Sc, Zr, V, Ta, Cr, Mo, W, Mn, Fe, Ru, Co, Ir, Ni, Cu, Zn, Cd, Ga, In, or Sb.

O is an oxygen element.

In addition, here, each of d and e indicates a composition ratio, and $0<d<1$ and e change depending on the valences of Ma and Mb.

Specific examples of the substance of the alignment control layer 13 include $BaRuO_3$ and $SrRuO_3$.

The thickness of the alignment control layer 13 is preferably 2 nm or more and 20 nm or less and more preferably about 10 nm.

That is, in the piezoelectric laminate 5B and the piezoelectric element 1B according to the present embodiment, similarly to the piezoelectric laminate 5 and the piezoelectric element 1 according to the first embodiment, the lower electrode layer 22 includes the metal layer 22c containing a Ni element and the surface layer 22b containing a Ni oxide or a Ni oxynitride, and in the electrode layer 22, the surface layer 22b is arranged on the side closest to the piezoelectric film 15. For this reason, it is possible to suppress the oxygen in the piezoelectric film 15, and as a result, it is possible to suppress the deterioration of piezoelectric characteristics and the deterioration of long-term reliability. Further, Ni is used as a metal species of the lower electrode layer 22, and thus the manufacturing cost can be significantly reduced as compared with the piezoelectric element in the related art, in which a metal of the Pt group has been used as the main component.

Also in the piezoelectric laminate 5B and the piezoelectric element 1B according to the present embodiment, the configuration of the lower electrode layer 22 is the same as that in the piezoelectric laminate 5A and the piezoelectric element 1A according to the second embodiment. As a result, the change in the content of the Ni element in the lower electrode layer 22 continuous, and thus the occurrence of peeling can be suppressed. Further, since the content of the Ni element is in an increasing trend from the side of the piezoelectric film 15 toward the substrate 10, the effect of suppressing the generation of the oxygen defect in the piezoelectric film 15 can be enhanced, and the effect of suppressing the deterioration of conductivity can be suppressed. Further, since the content of the Ni element monotonically increases from the side of the piezoelectric film 15, it is possible to further enhance the effect of suppressing the generation of oxygen defect in the piezoelectric film 15 and the effect of suppressing the deterioration of conductivity.

Further, the piezoelectric laminate 5B and the piezoelectric element 1B according to the present embodiment have the alignment control layer 13, and the piezoelectric film 15 is formed on the alignment control layer 13. As a result, it is possible to suppress the generation of the pyrochlore phase that is easily formed at the initial stage of film formation. Since the generation of the pyrochlore phase at the interface of the piezoelectric film 15 on side of the lower electrode layer 22 can be suppressed, the piezoelectric characteristics of the piezoelectric film 15 are good, and thus it is possible to obtain a high piezoelectric constant and high piezoelectricity as compared with a case where the alignment control layer 13 is not present.

The piezoelectric elements 1,1A, and 1B or the piezoelectric laminates 5, 5A, and 5B according to each of the above embodiments can be applied to an ultrasonic device, a mirror device, a sensor, a memory, and the like.

EXAMPLES

Hereinafter, specific examples and comparative examples of the piezoelectric element of the present disclosure will be described. First, a manufacturing method for a piezoelectric element of each example will be described. It is noted that the conditions other than the configuration of the lower electrode layer and the presence or absence of the alignment control layer are common in each example. A radio frequency (RF) sputtering device was used for the film formation of each layer.

Manufacturing Method

Substrate

A 6-inch Si wafer attached with a thermal oxide film was used as the substrate.

Lower Electrode Layer

A lower electrode layer was formed on the thermal oxide film of the substrate. The film formation conditions for the lower electrode layer in each example were as follows.

Comparative Example 1

Before the film formation of the lower electrode layer, a film of 20 nm of TiW was formed on the thermal oxide film of the substrate as an intimate attachment layer. Then, a film of 150 nm of Ir was formed on the TiW layer as the lower electrode layer under the conditions of an Ar gas of 60 sccm, an RF electric power of 300 W, and a film formation pressure of 0.25 Pa. The substrate temperature at the time of film formation of the TiW layer and the Ir layer was set to 350° C.

Comparative Example 2

A film of 150 nm of Ni was formed as the lower electrode layer under the conditions of an Ar gas of 60 sccm, an RF electric power of 300 W, a film formation pressure of 0.25 Pa, and a substrate temperature of 350° C.

Example 1

A film of 100 nm of Ni was formed as the metal layer under the conditions of an Ar gas of 60 sccm, an RF electric power of 300 W, a film formation pressure of 0.25 Pa, and a substrate temperature of 350° C. Subsequently, a film of 50 nm of a Ni oxide (NiO) was formed, as the surface layer, on the Ni layer under the conditions of an Ar gas of 30 sccm, an $O_2$ gas of 30 sccm, an RF electric power of 500 W, and a film formation pressure of 0.25 Pa. That is, the lower electrode layer had a two-layer structure consisting of a metal layer consisting of a Ni layer and a surface layer consisting of a NiO layer provided on an upper layer of the metal layer. In Table 1, in the item of the layer configuration of the lower electrode layer, the description is made in the order of the surface layer/the metal layer.

Examples 2 and 4 to 7

A film of 100 nm of Ni was formed as the metal layer under the conditions of an Ar gas of 60 sccm, an RF electric power of 300 W, a film formation pressure of 0.25 Pa, and a substrate temperature of 350° C. Subsequently, for each example, a film of 50 nm of a Ni oxide was formed on the Ni layer to form a surface layer under the conditions of an RF electric power of 500 W and a film formation pressure of 0.25 Pa, while gradually reducing the Ar gas from 60 sccm to 30 sccm and at the same time gradually increasing the $O_2$ gas from 0 sccm to 30 sccm. In a case where after the film formation of the metal layer, a film of a Ni oxide is formed by continuously changing the flow amounts of the Ar gas and the $O_2$ gas, the content of the Ni element gradually increases from the side of the surface toward the metal layer, which makes it possible to form a film of a Ni oxide layer in which the content of the O element gradually decreases. That is, in Examples 2 and 4 to 7, the lower electrode layer had a laminated structure of a metal layer consisting of a Ni layer and a Ni oxide layer consisting of a composition gradient layer in which the content of the Ni element and the content of the O element gradually change, where the Ni oxide layer had been provided on an upper layer of the metal layer. In Table 1, NiO (gradient, 50 nm) indicates that the Ni oxide layer is a composition gradient layer having a thickness of 50 nm. The content of the Ni element changed continuously between the metal layer and the surface layer and in the surface layer, and thus a seamless lower electrode layer was obtained.

Example 3

A film of 100 nm of Ni was formed as the metal layer under the conditions of an Ar gas of 60 sccm, an RF electric power of 300 W, a film formation pressure of 0.25 Pa, and a substrate temperature of 350° C. Subsequently, for each example, a film of 50 nm of a Ni oxynitride was formed on the Ni layer to form a surface layer under the conditions of an RF electric power of 500 W and a film formation pressure of 0.25 Pa, while gradually reducing the Ar gas from 60 sccm to 30 sccm and at the same time gradually increasing each of the $O_2$ gas and the $N_2$ gas from 0 sccm to 15 sccm. In a case where after the film formation of the metal layer, a film of a Ni oxide is formed by continuously changing the flow amounts of the Ar gas, the $O_2$ gas, and the $N_2$ gas, the content of the Ni element gradually increases from the side of the surface toward the metal layer, which makes it possible to form a film of a Ni oxynitride layer in which the content of the O element and the content of the N element gradually decrease. That is, in Examples 2 and 4 to 7, the lower electrode layer had a laminated structure of a metal layer consisting of a Ni layer and a Ni oxide layer consisting of a gradient layer in which the content of the Ni element gradually changes, where the Ni oxynitride layer had been provided on an upper layer of the metal layer. In Table 1, NiON (gradient, 50 nm) indicates that the Ni oxynitride layer is a composition gradient layer having a thickness of 50 nm. The content of the Ni element changed continuously between the metal layer and the surface layer and in the surface layer, and thus a seamless lower electrode layer was obtained.

Alignment Control Layer

In Example 4, Ar was allowed to flow on the lower electrode layer so that the substrate temperature was 500° C. and the film formation pressure was 0.8 Pa, and then a film of 10 nm of $BaRuO_3$ was formed as the alignment control layer.

In Example 5, Ar was allowed to flow on the lower electrode layer so that the substrate temperature was 500° C. and the film formation pressure was 0.8 Pa, and then a film of 10 nm of $SrRuO_3$ was formed as the alignment control layer.

It is noted that the alignment control layer is not provided in other examples and the comparative examples.

Piezoelectric Film

Comparative Examples 1 and 2 and Examples 1 to 3

As a target material, a sintered body of $Pb_{1.3}(Zr_{0.46}Ti_{0.42}Nb_{0.12})O_3$ having a diameter of 120 mm was used. A film of Nb-doped PZT (hereinafter, referred to as N-PZT) was formed as a piezoelectric film under the conditions of a vacuum degree of 0.3 Pa, an $Ar/O_2$ mixed atmosphere ($O_2$ volume fraction: 2.0%), an RF output of 500 W, and a substrate temperature of 600° C. The thickness of the piezoelectric film was 2 µm.

Examples 4 and 5

As a target material, a sintered body of $Pb_{1.15}(Zr_{0.46}Ti_{0.42}Nb_{0.12})O_3$ having a diameter of 120 mm was used. The film formation was carried out under the same film formation conditions as in Example 1 except that the substrate temperature was set to 550° C.

Example 6

A target material of $Pb_{1.3}(Zr_{0.325}Ti_{0.285}Nb_{0.3}Ni_{0.09})O_3$ was used. The film formation conditions were the same as in Example 1.

Example 7

A target material of $Pb_{1.3}(Zr_{0.4125}Ti_{0.3725}Nb_{0.2}Sc_{0.015})O_3$ was used. The film formation conditions were the same as in Example 1.

A laminated substrate in which a lower electrode and a piezoelectric film were laminated on the substrate was obtained as described above. It is noted that regarding the laminated substrates of each example and comparative example, a diffraction pattern due to X-ray diffraction was acquired by an X-ray diffractometer manufactured by Malvern Panalytical, whereby it was confirmed that the piezoelectric film has a perovskite type structure.

Measurement of Element Distribution in Lower Electrode Layer

Figure 6:
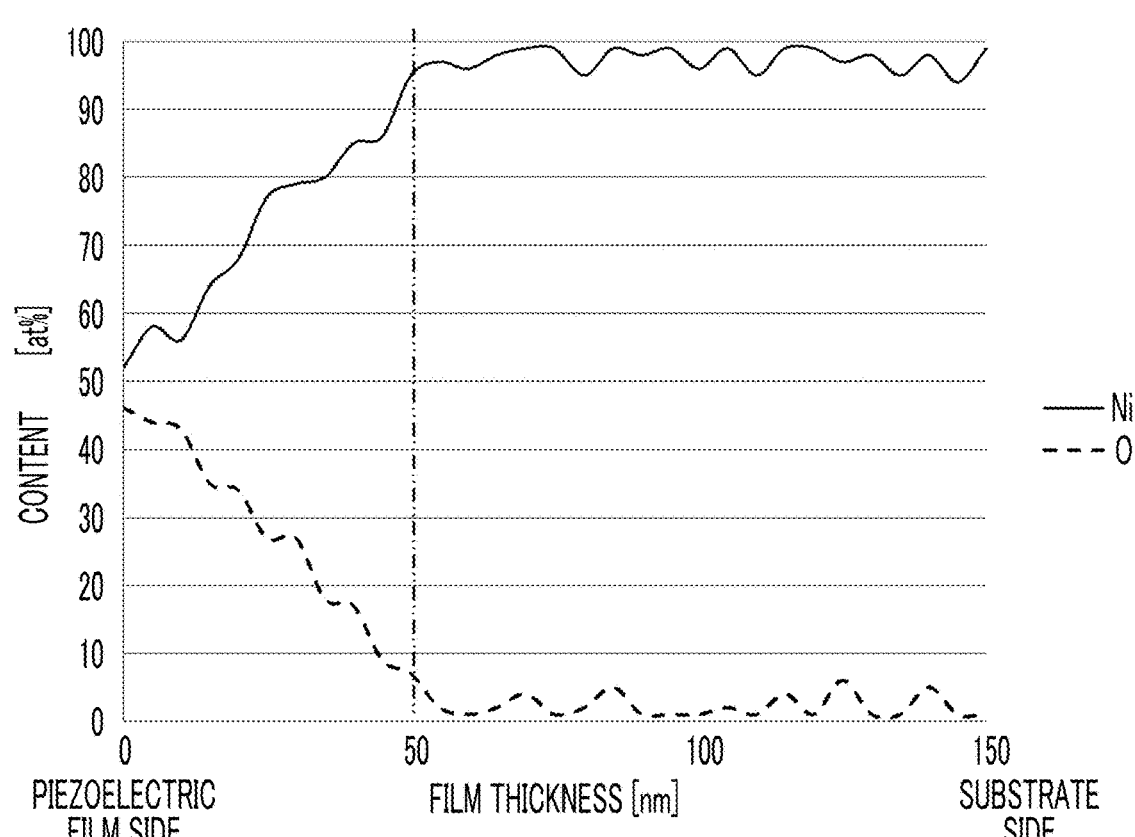
FIG. 6 is a graph showing profiles of contents of a Ni element and an O element in a thickness direction of a lower electrode layer in the piezoelectric element of Example 2.

The element distribution in the thickness direction of the lower electrode layer can be measured according to a secondary ion mass spectrometry (SIMS) analysis. As an example, the data obtained according to the SIMS analysis using a sample having the lower electrode layer of Example 2 is shown in FIG. 6. The sample was irradiated with an $Ar^+$ ion, and the analysis was carried out while cutting the sample from the surface side of the Ni oxide layer.

In FIG. 6, the horizontal axis is the position in the thickness direction of the lower electrode layer, 0 is the surface position of the lower electrode layer, and the closer to the side on the right of the horizontal axis is, the closer to the substrate is. As shown in FIG. 6, at the surface position of the lower electrode layer, the contents of both Ni element and O element were in the vicinity of 50 at %. The content of the Ni element gradually increased from the surface toward the side of the substrate and reached substantially 100 at % at about 50 nm, exhibiting a constant value. On the other hand, the content of the N element gradually decreased from the surface toward the side of the substrate and reached substantially 0 at % at about 50 nm, exhibiting a constant value. It is revealed that in a case where in the lower electrode layer of Example 2, the flow rate ratio between the Measurement An impedance analyzer manufactured by Agilent Technologies, Inc. was used to measure the dielectric constant. An alternating current voltage having a frequency of 1 kHz was applied to the piezoelectric element of each example, and the dielectric constant was calculated from the measured impedance value. The obtained dielectric constants are shown in Table 1.

Comparative Example 1 is a piezoelectric element having a lower electrode layer consisting of Ir, which has been used in the related art, and it is an example in which the dielectric constant is good. In Table 1, the ratio of the dielectric constant for each Example and Comparative Example to that of Comparative Example is shown together.

Drive Stability Test

For the drive stability (durability) test, the sample prepared for measuring the dielectric constant was used. In an environment of 150° C., the lower electrode layer was grounded, a voltage of –30 V was applied to the upper electrode layer, and the time (hr) taken from the start of the voltage application to the occurrence of dielectric breakdown was measured. The measurement results are shown in Table 1. Here, it is regarded that dielectric breakdown has occurred at the time in a case where a current of 1 mA or more has flowed through the piezoelectric element.

TABLE 1

| | | | | | Evaluation of piezoelectric element | |
| --- | --- | --- | --- | --- | --- | --- |
| Item | Layer configuration of lower electrode layer (thickness) | Alignment control layer | Composition of piezoelectric film | Dielectric constant ε | Dielectric constant ε/dielectric constant of Comparative Example 1 [%] | Durability (h) |
| Comparative Example 1 | Ir (150 nm) | Absent | Nb-PZT Nb 12% | 1250 | 100 | 10 |
| Comparative Example 2 | Ni (150 nm) | Absent | Nb-PZT Nb 12% | 1100 | 88 | 5 |
| Example 1 | NiO (50 nm)/Ni (100 nm) | Absent | Nb-PZT Nb 12% | 1300 | 104 | 65 |
| Example 2 | NiO (gradient, 50 nm)/Ni (100 nm) | Absent | Nb-PZT Nb 12% | 1350 | 108 | 80 |
| Example 3 | NiON (gradient, 50 nm)/Ni (100 nm) | Absent | Nb-PZT Nb 12% | 1200 | 96 | 70 |
| Example 4 | NiO (gradient, 50 nm)/Ni (100 nm) | $BaRuO_3$ | Nb-PZT Nb 12% | 1280 | 102.4 | 90 |
| Example 5 | NiO (gradient, 50 nm)/Ni (100 nm) | $SrRuO_3$ | Nb-PZT Nb 12% | 1320 | 105.6 | 80 |
| Example 6 | NiO (gradient, 50 nm)/Ni (100 nm) | Absent | Nb-PZT Nb 30%, Ni 9% | 1230 | 98.4 | 75 |
| Example 7 | NiO (gradient, 50 nm)/Ni (100 nm) | Absent | Nb-PZT Nb 12%, Sc 1.5% | 1290 | 103.2 | 75 |

Ar gas and the $O_2$ gas is gradually changed at the time of film formation of the surface layer, it is possible to obtain a surface layer having a profile in which the contents of the Ni element and the O element gradually change in the thickness direction as illustrated in FIG. 6.

Measurement of Dielectric Constant

Preparation of Measurement Sample

The laminated substrate was subjected to dicing processing to a size of an one-inch (25 mm) square to produce a piezoelectric laminate of an one-inch square. An ITO layer having a thickness of 100 nm was formed by sputtering in a state where a metal mask having a circular opening having a diameter of 400 μm was arranged on the piezoelectric film. As a result, a sample for measuring the dielectric constant, having a size of 1 inch square and having a circular upper electrode layer having a diameter of 400 μm at the center of the surface of the piezoelectric film, was obtained.

In a case where the lower electrode layer of Comparative Example 1, consisting of Ir, is provided, the dielectric constant is relatively high, which is favorable; however, the durability is low and the long-term reliability is lacking. A case where the lower electrode layer consisting of a Ni layer is provided as in Comparative Example 2 gives such results that the dielectric constant is low by 10% or more lower as compared with Comparative Example 1 having an Ir layer as the lower electrode layer, and thus it is revealed that the piezoelectric characteristics are low as compared with the element in the related art.

Example 1 has, as the lower electrode layer, a metal layer consisting of Ni and a surface layer consisting of a Ni oxide of which the composition does not change in the thickness direction. In this configuration, the results were such that the dielectric constant was high and the durability was significantly high as compared with Comparative Example 1.

It is revealed that in the piezoelectric elements of Examples 1 to 7, the dielectric constant is high or is reduced by only 4% or less as compared with Comparative Example, and thus good piezoelectric characteristics are provided. In addition, in Examples 1 to 7, the durability significantly improved as compared with Comparative Example 1. However, in Example 1, the durability is slightly inferior to Examples 2 to 7. It is conceived that in Examples 2 to 7, the composition change in the lower electrode layer is continuous, and thus peeling is difficult to occur as compared with Example 1, whereby the durability is further improved.

In particular, the piezoelectric elements of Examples 4 and 5 having the alignment control layer have a dielectric constant comparable to those of the case where the Ir electrode layer is provided, and they have a great effect of improving durability. The results obtained from Examples 2 and 3 were such that the effect of improving the piezoelectricity and the effect of improving durability are high in a case where the surface layer of the lower electrode layer is a NiO gradient layer as compared with a case where it is a NiON gradient layer.

In Examples 1 to 7, only Ni is used as the metal species in the lower electrode layer, and thus the material cost can be significantly suppressed as compared with a case where Ir is used. It is revealed that as shown in Examples 1 to 7, according to the present disclosed technology, it is possible to provide a piezoelectric element that exhibits piezoelectric characteristics comparable to those of the piezoelectric element in the related art using Ir in the lower electrode layer and has high reliability, and with which the manufacturing cost can be significantly reduced.

What is claimed is:

1. A piezoelectric laminate comprising, on a substrate in the following order:

a lower electrode layer; and a piezoelectric film containing a perovskite-type oxide, wherein the lower electrode layer includes a metal layer containing Ni and a surface layer containing a Ni oxide or a Ni oxynitride, and the surface layer in the lower electrode layer is arranged a side closest to the piezoelectric film, wherein in a thickness direction of the surface layer, a content of Ni in the lower electrode layer, which includes the Ni oxide or the Ni oxynitride, gradually increases from the side closest to the piezoelectric film toward the metal layer, and a change of the content of the Ni is continuous in the thickness direction from the surface layer to the metal layer without discontinuity.

2. The piezoelectric laminate according to claim 1, wherein a thickness of the surface layer is 20 nm to 60 nm.

3. The piezoelectric laminate according to claim 1, further comprising:

an alignment control layer containing a metal oxide different from the Ni oxide, between the lower electrode layer and the piezoelectric film.

4. The piezoelectric laminate according to claim 3, wherein the metal oxide contains at least one of Sr or Ba.

5. The piezoelectric laminate according to claim 1, wherein the perovskite-type oxide contains Pb, Zr, Ti, and O.

6. The piezoelectric laminate according to claim 5, wherein the perovskite-type oxide contains at least one of Nb, Sc, or Ni.

7. The piezoelectric laminate according to claim 6, wherein the perovskite-type oxide is a compound represented by General Formula (1), $$Pb\{(Zr_xTi_{1-x})_{1-y}Nb_y\}O_3 \tag{1}$$

$0<x<1, 0.1 \leq y \leq 0.4$.

8. A piezoelectric element comprising:

the piezoelectric laminate according to claim 1; and an upper electrode layer provided on the piezoelectric film of the piezoelectric laminate.

* * * * *